United States Patent
Jang et al.

(10) Patent No.: US 6,542,002 B2
(45) Date of Patent: Apr. 1, 2003

(54) HYBRID POWER SUPPLY CIRCUIT AND METHOD FOR CHARGING/DISCHARGING A LOGIC CIRCUIT USING THE SAME

(75) Inventors: Ho-rang Jang, Kyungki-do (KR); Ki-won Jo, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/071,086

(22) Filed: Feb. 11, 2002

(65) Prior Publication Data

US 2002/0158660 A1 Oct. 31, 2002

(30) Foreign Application Priority Data

Mar. 9, 2001 (KR) .......................................... 2001-12245

(51) Int. Cl.[7] .............................................. H03K 19/00
(52) U.S. Cl. ........................ 326/82; 326/93; 331/117 R
(58) Field of Search .................. 331/117 R; 326/93–98, 326/26, 82

(56) References Cited

U.S. PATENT DOCUMENTS

| | | | |
|---|---|---|---|
| 5,559,463 A | * | 9/1996 | Denker et al. ............... 327/300 |
| 5,559,478 A | | 9/1996 | Athas et al. |
| 5,701,093 A | * | 12/1997 | Suzuki ......................... 326/98 |
| 5,734,285 A | * | 3/1998 | Harvey ....................... 327/291 |
| 6,446,816 B1 | * | 9/2002 | Miller ........................... 211/5 |

* cited by examiner

Primary Examiner—Don Le
(74) Attorney, Agent, or Firm—Burns, Doane, Swecker & Mathis, LLP

(57) ABSTRACT

A hybrid power supply circuit for supplying a power to a logic circuit performing a digital logic process and for controlling the charging/discharging of the logic circuit. The power supply circuit has an adiabatic power supply portion for charging/discharging the logic circuit in such a manner to suppress a sudden current change during initial time after the input signal changes, and a CMOS power supply portion for quickly charging/discharging the logic circuit to supply power level/ground level after the charging/discharging by the adiabatic power supply portion. The energy consumption of the circuit decreases even in a digital system having a plurality of logic circuits.

14 Claims, 8 Drawing Sheets

HYBRID POWER SUPPLY CIRCUIT AND METHOD FOR CHARGING/DISCHARGING A LOGIC CIRCUIT USING THE SAME

Priority is claimed to Patent Application Number 2001-12245 filed in Rep. Of Korea on Mar. 9, 2001, herein incorporated by reference.

BACKGROUND OF THE INVENTION

1. Field of the Invention

The present invention relates to a power supply circuit, and more particularly, to a hybrid power supply circuit combining a CMOS power supply portion to quickly charge/discharge a logic circuit and an adiabatic charging portion to minimize the power consumption during charging/discharging.

2. Description of the Related Art

Recently, the power consumption in digital circuits is under very intensive study since many electronic products have become mobile units which require low power consumption and long battery duration.

Most digital circuits are implemented with CMOS circuitry. FIG. 1 shows a CMOS inverter circuit.

Referring to FIG. 1, an output voltage Vo can be a power voltage Vdd or grounded depending on an input voltage Vi. When the input Vi is a ground voltage GND (hereinafter will be referred as "low"), a transistor P turns on and a transistor N turns off. Accordingly, the current flows from power supply Vdd to an output capacitor C so as to be charged to the level of supply voltage Vdd (hereinafter will be referred as "high"). The other case, when the input voltage Vi is high, the transistor N turns on and the transistor P turns off. Accordingly, the current flows out from capacitor C to the ground so as to be discharged.

In case of above mentioned CMOS inverter circuit, capacitor C is charged or discharged in a short time in response to the input Vi and abruptly varied its voltage at an initial phase. So, the sudden variation in voltage during the charging/discharging results in a sudden increase of energy in the circuit and a heat dissipation in the transistors.

FIG. 2 shows an equivalent diagram of the inverter of FIG. 1 during charging. Referring to FIG. 2, an electric charge Q is supplied to the capacitor C through a resistance R. The energy consumption E during the charging is calculated as follows:

$$E = E_{supply} - E_{store} = \int V_{dd} i dt - \int v_c i dt = \frac{1}{2} C V_{dd}^2 \quad \text{[Equation 1]}$$

Here, $E_{supply}$ is the energy being supplied, $E_{store}$ is the energy stored in capacitor C. That is, the energy E consumed during charging capacitor C is $E_{supply}$ less $E_{store}$.

On the other hand, an adiabatic charging method can adjust the charging time by using a current source thereby minimizing the energy consumption. FIG. 3 shows an equivalent diagram of the adiabatic charging circuit. Referring to FIG. 3, the energy consumption E during charging capacitor C is represented as follows:

$$E = \int i^2 R dt = \left(\frac{Q}{t}\right)^2 Rt = \frac{R}{t}(CV_{dd})^2 = \frac{RC}{t} CV_{dd}^2 \quad \text{[Equation 2]}$$

As above, the energy consumption E can be obtained by integrating the square of current multiplied by resistance along time. Referring to Equation 2, the energy consumption E is proportional to the charging time t. At the extreme, when charging time goes to infinity, the energy can be supplied without heat dissipation. That is, to minimize the stream of the current (the velocity of charge), the collision to the resistance can be minimized. This implies that to avoid the sudden current changes as in CMOS circuit, an inductor can be used to control the current thereby minimizing the energy consumption.

FIG. 4 shows a power supply source using an inductor. Referring to FIG. 4, the charge to capacitor C and the discharge to inductor L are done depending on a resonance between capacitor and inductor so that energy needed is only the energy consumed during the charge/discharge.

Various methods to implement power source using the inductor have been proposed (U.S. Pat. No. 5,559,478). Most proposals use the resonance between the inductance and capacitance already fixed for deciding on charging or discharging speed of the circuit. In these cases, if the resonance frequency is used in deciding on the charging/discharging speed, the charging/discharging time and the resonance frequency are changed by changes in inductance and capacitance in the power supply circuit. The inductance and capacitance in the circuit may be changed by the circuitry making conditions such as temperature and processes therein, and also be changed by the operation of the circuit. In addition, to recharge the consumed energy, a switch S2 in FIG. 4 must be turned on. However, the switch control is not easy because of the varying charging/discharging time so that the commercial implementation of them is difficult.

SUMMARY OF THE INVENTION

To solve the above problems, it is an object of the present invention to provide a hybrid power supply circuit combining a CMOS power supply for quick charging/discharging a logic circuit and an adiabatic charging circuit for minimizing an energy consumption in charging/discharging.

Another object of the present invention is to provide a method for charging/discharging using the hybrid power supply circuit.

Still another object of the present invention is to provide a method for effectively charging/discharging a plurality of logic circuits which constitute a digital system by using the hybrid power supply circuit.

To achieve the first object of the invention, there is provided a power supply circuit for supplying a power to a logic circuit performing a digital logic process in response to an input signal and for controlling charging/discharging the logic circuit according to a process result, the power supply circuit comprising: an adiabatic power supply portion for charging/discharging the logic circuit in such a manner to suppress a sudden current change during a first predetermined time after the input signal changes; and a CMOS power supply portion for quickly charging/discharging the logic circuit to supply power level/ground level during a second predetermined time after the first predetermined time.

To achieve the second object of the invention, there is provided a method for charging/discharging a logic circuit performing a digital logic algorithm in response to an input signal by using a hybrid power supply circuit having an adiabatic power supply portion and a CMOS power supply portion, the method comprising the steps of: charging/discharging the logic circuit according to an output thereof by using the adiabatic power supply portion during a first predetermined time after the input signal changes; and charging/discharging the logic circuit to a required levels by using the CMOS power supply portion during a second predetermined time after the first predetermined time.

To achieve the third object of the invention, there is provided a method for charging/discharging a plurality of logic circuits in a digital system having the logic circuits operating synchronized to a system clock signal determined by a maximum delay time and a hybrid power supply circuit including an adiabatic power supply portion and a CMOS power supply portion for supplying a power to the logic circuits, the method comprising the steps of: (a) comparing all of the delay times of the logic circuits so as to determine the maximum delay time and comparing a delay time of a logic circuit to be charged/discharged with the maximum delay time; (b) charging/discharging the logic circuit to a required level by using the CMOS power supply portion if the delay time of the logic circuit is identical to the maximum delay time in step (a); (c) charging/discharging the logic circuit by using the adiabatic power supply portion during a first predetermined time if the delay time of the logical circuit is shorter than the maximum delay time in step (a); and (d) charging/discharging the logic circuit to a supply power level or a ground level after the first predetermined time.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

Hereinafter, the present invention will be described in detail with reference to the accompanying drawings.

Figure 1:
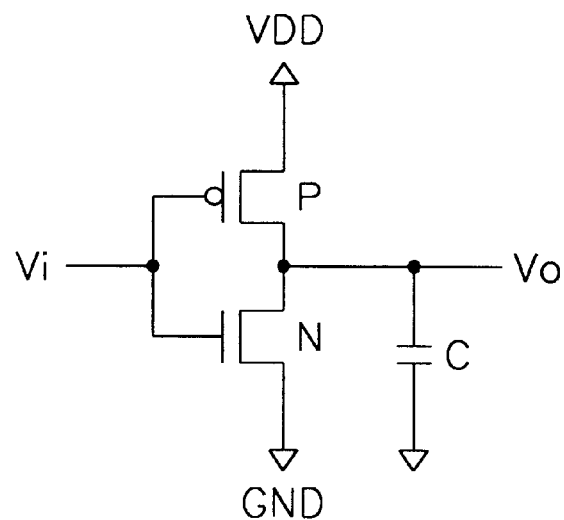
FIG. 1 is a circuit diagram of a CMOS inverter.
Figure 2:
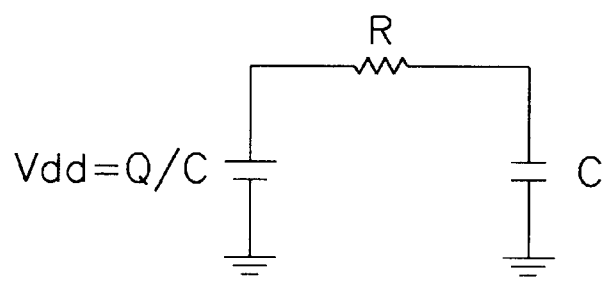
FIG. 2 is an equivalent circuit diagram of the inverter during charging.
Figure 3:
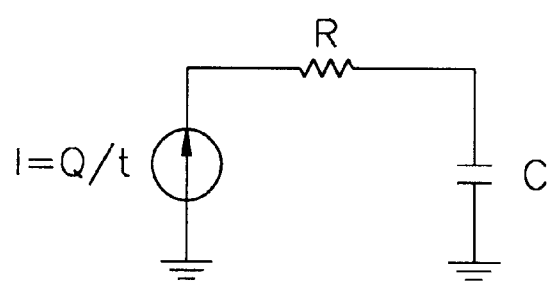
FIG. 3 is an equivalent circuit diagram of an adiabatic power supply circuit.
Figure 4:
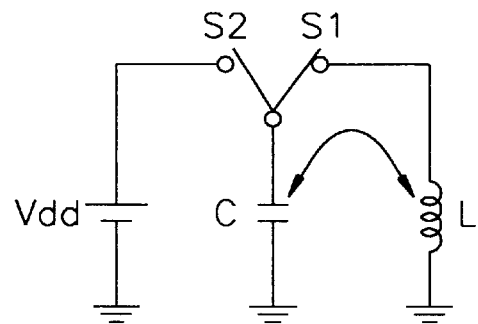
FIG. 4 is a circuit diagram of a power source using an inductor.
Figure 5:
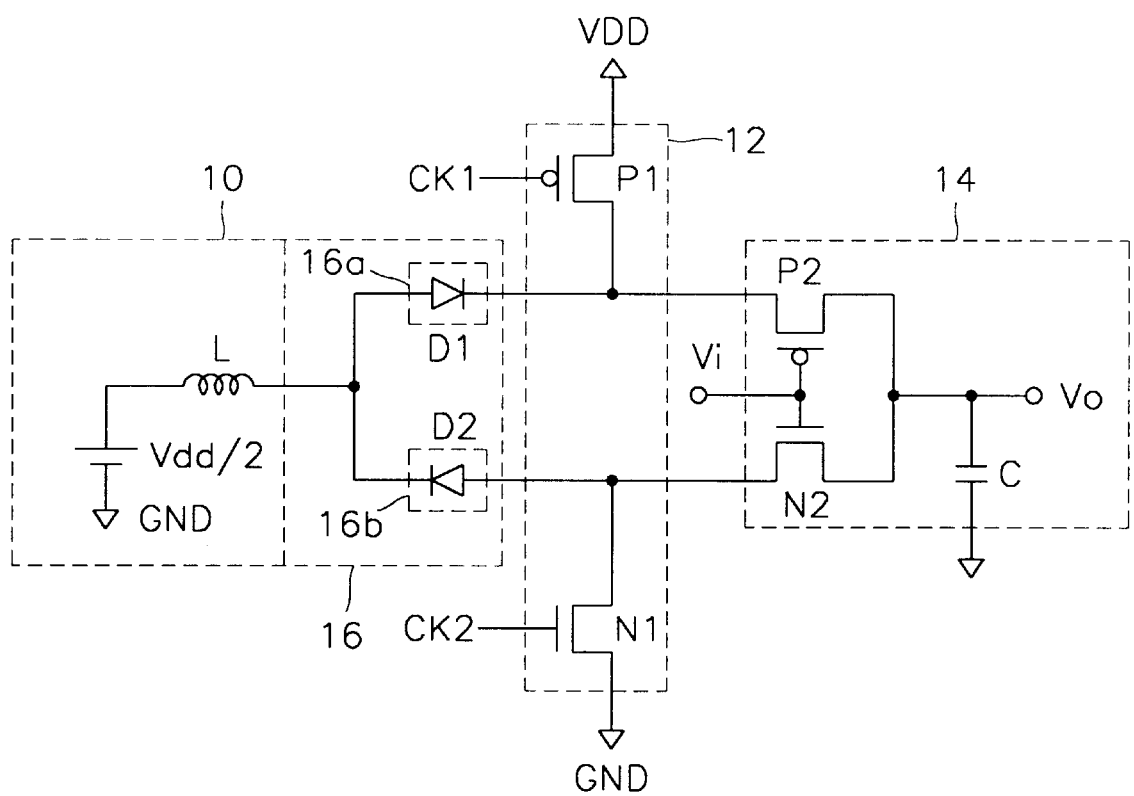
FIG. 5 is a circuit diagram of a hybrid power supply circuit in accordance with an embodiment of the present invention.

FIG. 5 is a circuit diagram of a hybrid power supply circuit in accordance with an embodiment of the present invention. According to one embodiment, the hybrid power supply circuit includes an adiabatic power supply portion 10, inverse current blocking means 16, a CMOS power supply portion 12 and a logic circuit portion 14.

Referring to FIG. 5, the logic circuit portion 14 performs a predetermined operation power-sourced by adiabatic power supply portion 10 or CMOS power supply portion 12. Although there is shown an inverter having transistors P2 and N2 in FIG. 5, the logic circuit portion can be an adder, a multiplexer and so on.

Logic circuit portion 14 performs a digital logic operation in response to an input signal Vi and outputs Vo. When input signal Vi is high, Vo will be low, and vice versa. At this time, to set output signal Vo to high, a capacitor C must be charged. On the contrary, to set output signal Vo to low, capacitor C may be discharged.

Adiabatic power supply portion 10 charges or discharges capacitor C for a predetermined time right after the input signal Vi varies in power level. While charging or discharging capacitor C by using adiabatic power supply portion 10, CMOS power supply portion 12 is deactivated in response to first and second clock signals CK1 and CK2. At this time, adiabatic power supply portion 10 suppresses a sudden current generation due to a sudden variation of power level of input signal Vi. As shown in FIG. 5, adiabatic power supply portion 10 includes an inductor L so as to suppress an excessive current from flowing to logic circuit portion 14 when input signal Vi changes to low from high and suppresses an excessive current from flowing to adiabatic power supply portion 10 when input signal Vi changes to high from low.

Inverse current blocking means 16 suppresses current from flowing in inverse direction while charging or discharging capacitor C by using adiabatic power supply portion 10. Preferably, inverse current blocking means 10 includes first and second inverse current blocking means 16a and 16b.

The first blocking means 16a blocks current to adiabatic power supply portion 10 from capacitor 14 while the capacitor C is charged by adiabatic power supply portion 10. As shown in FIG. 5, first blocking means 16a includes first diode D1 connected in a forward current flow from the adiabatic power supply 10 to the logic circuit portion 14 between the adiabatic power supply portion 10 and the logic circuit portion 14.

The second blocking means 16b blocks current to logic circuit portion 14 from adiabatic power supply portion 10 while the capacitor C is discharged by adiabatic power supply portion 10. As shown in FIG. 5, second blocking means 16b includes second diode D2 connected in a forward current flow from the logic circuit portion 14 to the adiabatic power supply 10 between the adiabatic power supply portion 10 and the logic circuit portion 14.

Thereafter when adiabatic power supply portion 10 charges or discharges logic circuit portion 14, CMOS power supply portion 12 charges logic circuit portion 14 up to a supply power Vdd or discharges down to a ground GND in response to first and second clock signals CK1 and CK2. At this time, the charging and discharging by CMOS power supply portion 12 are much faster than by adiabatic power supply portion 10. Referring to FIG. 5, CMOS power supply portion 12 includes a transistor P1 controlled by first clock signal CK1 and a transistor P2 controlled by second clock signal CK2. When transistor P1 is turned on in response to first clock signal CK1, current flows from supply power Vdd to logic circuit portion 14 so as to charge. When transistor N1 is turned on in response to second clock signal CK2, current flows from logic circuit portion 14 to ground GND so as to discharge.

Referring now to FIG. 5, the charging and discharging operation of logic circuit portion 14 will be described in detail.

Figure 6:
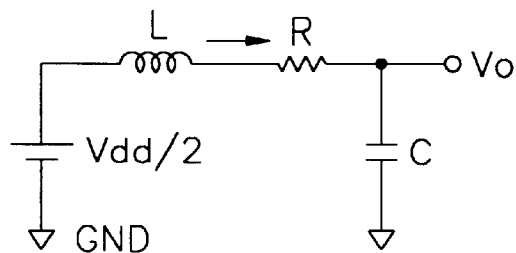
FIG. 6 is an RLC equivalent circuit diagram when current flows between an adiabatic power supply portion 10 and a logic circuit portion 14 of FIG. 5.
Figure 7:
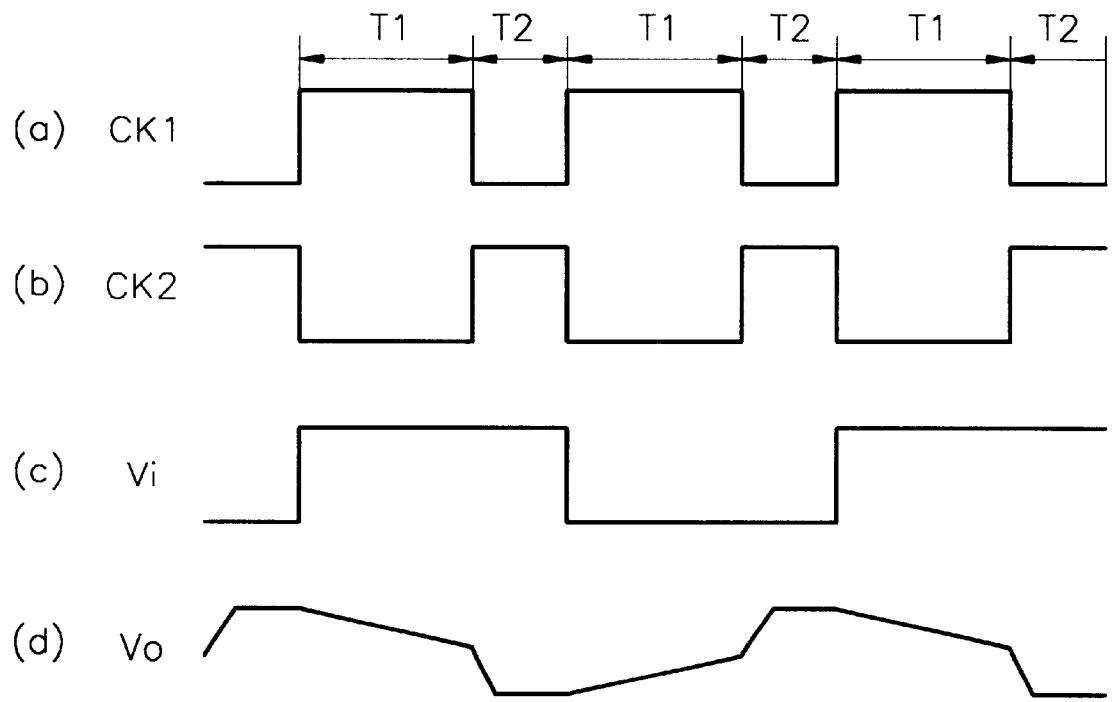
FIGS. 7(a) to 7(d) are graphs illustrating the signal patterns of FIG. 5.

First, the charging operation during low input signal Vi will be explained. Transistor P2 is turned on and N2 is turned off by the low input signal Vi. Then, a path is opened between adiabatic power supply portion 10 and logic circuit portion 14. FIG. 6 shows an RLC equivalent circuit when adiabatic power supply portion 10 communicates with logic circuit portion 14. In FIG. 6, R represents the resistance when transistor P2 is turned on. The characteristic of the RLC circuit can be represented as follows Equations 3 and 4:

$$\frac{Vdd}{2} = L\frac{di}{dt} + Ri + \frac{1}{C}\int i\,dt \qquad \text{[Equation 3]}$$

$$i(t) = I_o e^{-j\beta t} + e^{j\beta t}) \qquad \text{[Equation 4]}$$

If we assume that R is so little as negligible, output voltage Vo can be rewritten as Equation 5.

$$Vo(t) = Vc\{1 - \cos(\omega_0 t)\} \qquad \text{[Equation 5]}$$

Referring to Equation 5, output power rises up to double of voltage Vdd/2 of adiabatic power supply portion 10. That is, output voltage Vo rises up to Vdd. Meanwhile as mentioned above, in a circuit of FIG. 6, the charging of capacitor C and discharging to inductor L are periodically performed depending on the resonance frequency determined by the value of capacitor C and inductor L. That is, after a lapse of predetermined time since capacitor C is charged, the charge charged therein is discharged to inductor L. The First diode D1 (FIG. 5) blocks an inverse current formed during the discharging thereby preventing the output voltage drop.

As aforementioned, the output voltage Vo is shown to rise up to twice the level of voltage Vdd/2 of adiabatic power supply portion 10 when there is no resistance R. However, there exists a resistance R at transistor P2 and there lies first diode D1, so the output voltage Vo cannot reach Vdd. Also, even if there is no effect of transistor P2 and first diode D1, the charging of capacitor C up to supply level Vdd may be not performed in time. This is due to the fact that the charging time is determined by the resonance frequency. The charging time Tc can be approximated as follows:

$$\omega_0 T_c = \frac{T_c}{\sqrt{LC}} = \pi \qquad \text{[Equation 6]}$$

$$T_c = \pi \sqrt{\sqrt{LC}}$$

The charging time Tc is not one that can be adjusted by user but is determined by inductor L and capacitor C and is different with circuits.

Meanwhile, although we can reduce the power consumption by using adiabatic power supply portion 10, we may not charge or discharge to a desired level. Accordingly, during a time, capacitor C is charged by adiabatic power supply portion 10 and then to charge to a desired level, a first clock signal CK1 is applied so as to turn on a transistor P1. Then current flows from CMOS power supply portion 12 at a Vdd to capacitor C in a quick time so as to make output voltage Vo reach to Vdd.

On the other hand, the discharge of capacitor C of logic circuit portion 14 by an input signal Vi will be illustrated. As input signal Vi of power voltage changes, at first initial period where a transistor P2 is turned off and a transistor N2 is turned on, transistors P1 and N1 of CMOS power supply portion 12 are turned off by first and second clock signals CK1 and CK2. Then, adiabatic power supply portion 10 and logic circuit portion 14 communicate with each other as shown FIG. 6, an equivalent diagram, except that the direction of current is opposite. Referring to FIG. 6, current can flow between inductor L and capacitor C with a resonance frequency determined thereby. During the discharging, the charge cannot flow to capacitor C from inductor L blocked by a second diode D2. Accordingly, current flows only in direction of capacitor C to inductor L thereby discharging capacitor C. Afterwards, to quicken the discharging down to the ground level, a second clock signal CK2 is applied. Then, transistor N1 is turned on so as to discharge the capacitor C in a quick manner.

FIGS. 7a to 7d show operation waveforms of circuit in FIG. 5.

Referring to FIG. 5 and FIGS. 7a to 7d, period T1 is a sequence where capacitor C in the logic circuit portion 14 is charged or discharged by using adiabatic power supply portion 10, and period T2 is where using CMOS power supply portion 12. First, an output voltage Vo of logic circuit portion 14 is slowly charged or discharged by adiabatic power supply portion 10. Thereafter, at T2, output voltage Vo is fast charged up to supply power level Vdd or is fast discharged down to the ground level Gnd by CMOS power supply portion 12.

As described above, in a preferred embodiment of the invention, the hybrid power supply circuit charges and discharges logic circuit portion 14 in such a manner that in an initial phase of input voltage Vi varies, the invention operates adiabatic power supply portion 10 and afterwards, the invention operates CMOS power supply portion 12 to fast charge or discharge in time.

Figure 8:
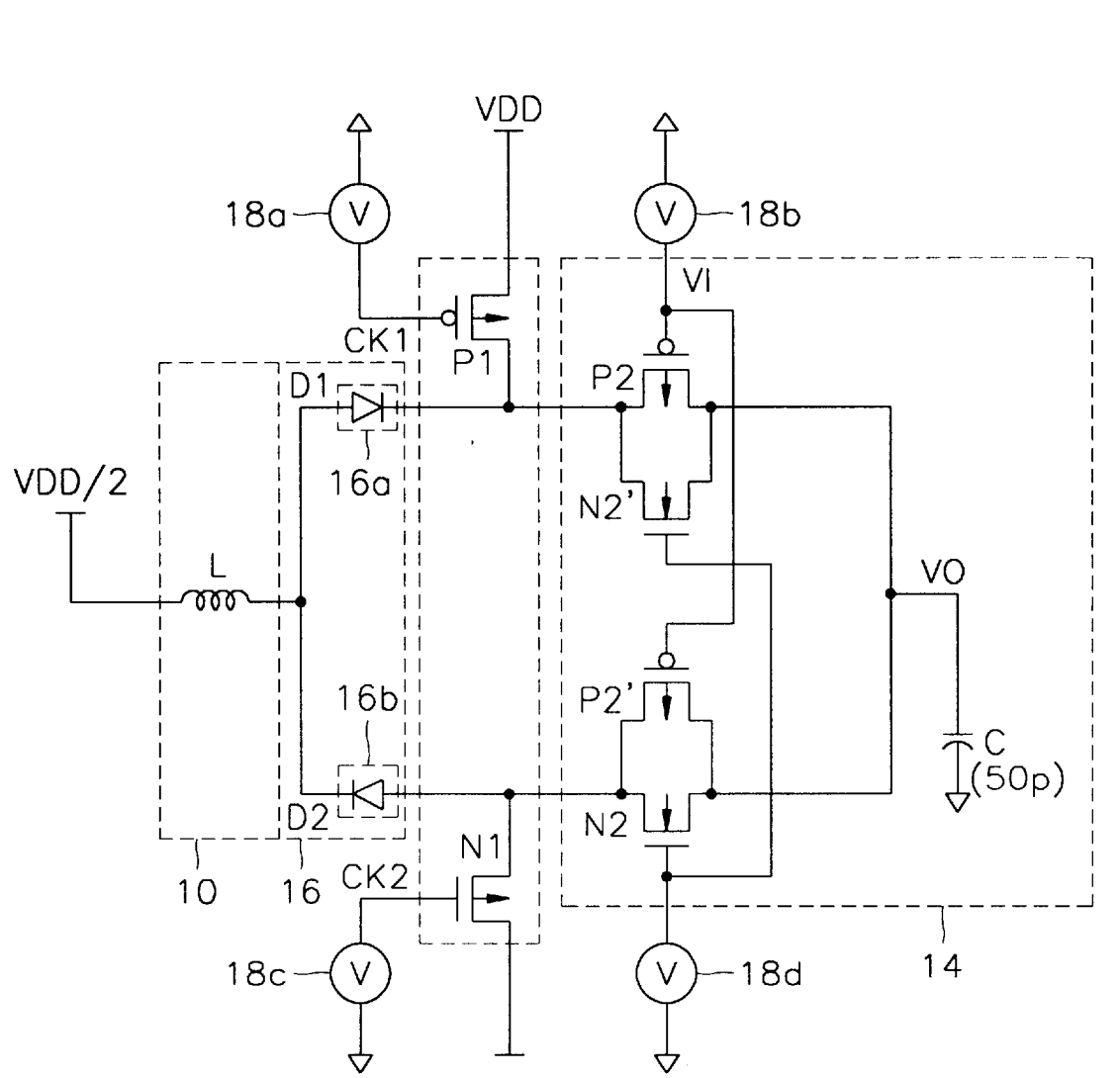
FIG. 8 is a circuitry to simulate the circuit in FIG. 5.

FIG. 8 shows a circuit to simulate the circuit in FIG. 5. The reference numbers given the same number as in FIG. 5 represent the same elements. Here, complementary transistors N2' and P2' are further implemented corresponding to transistors P2 and N2 to reduce the resistance.

Figure 9:
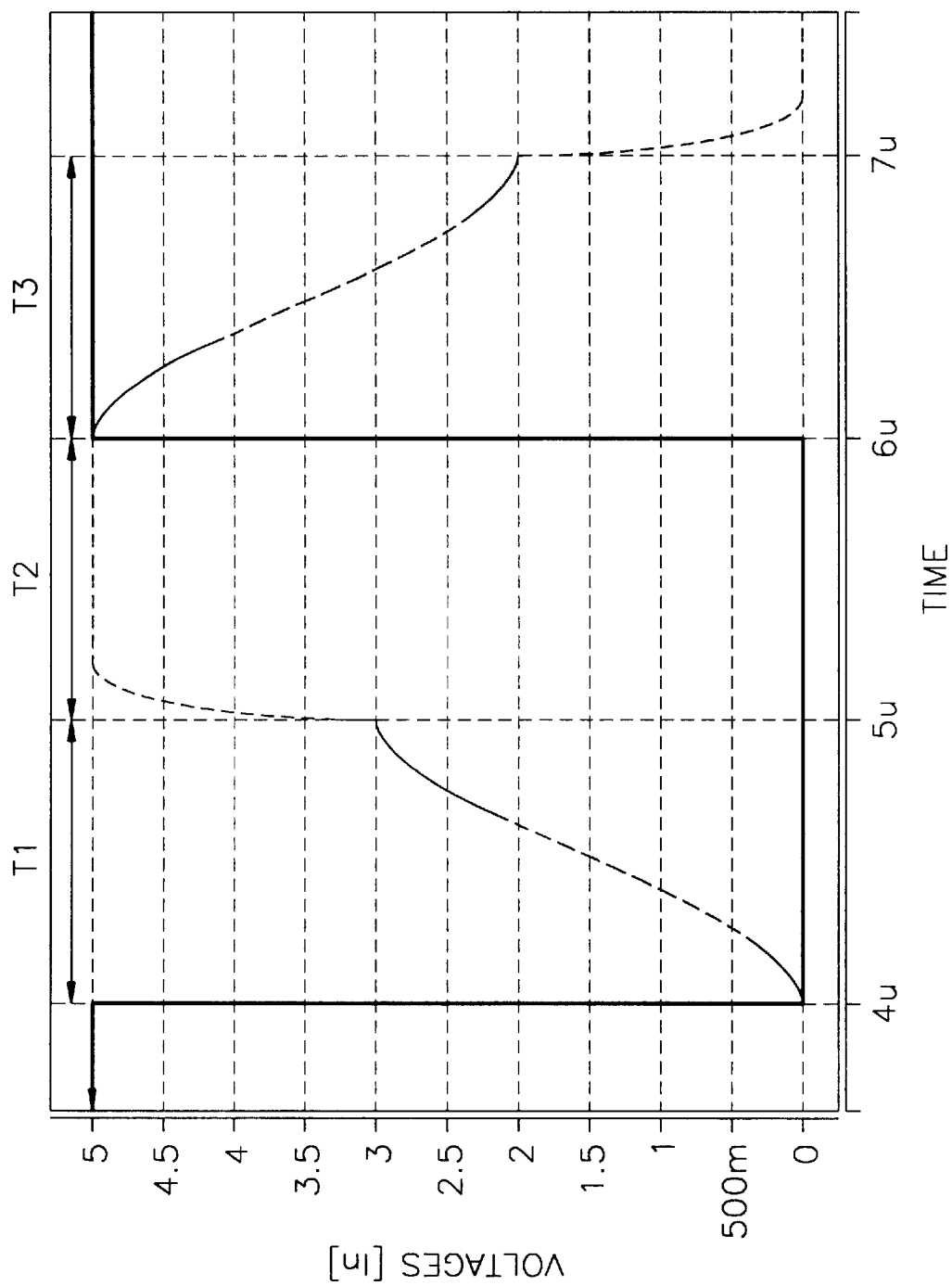
FIG. 9 is a graph showing the output signal Vo versus input signal Vi in FIG. 8.

FIG. 9 shows a graph of output signal Vo versus input signal Vi in the circuit of FIG. 8. Referring to FIG. 9, during period T1 right after when input signal Vi changes from high to low or low to high, output signal Vo changes slowly by adiabatic power supply portion 10. Thereafter, during T2, output signal Vo abruptly varies by CMOS power supply portion 12 to a desired level, supply power level Vdd, in the FIG. 5.

Figure 10:
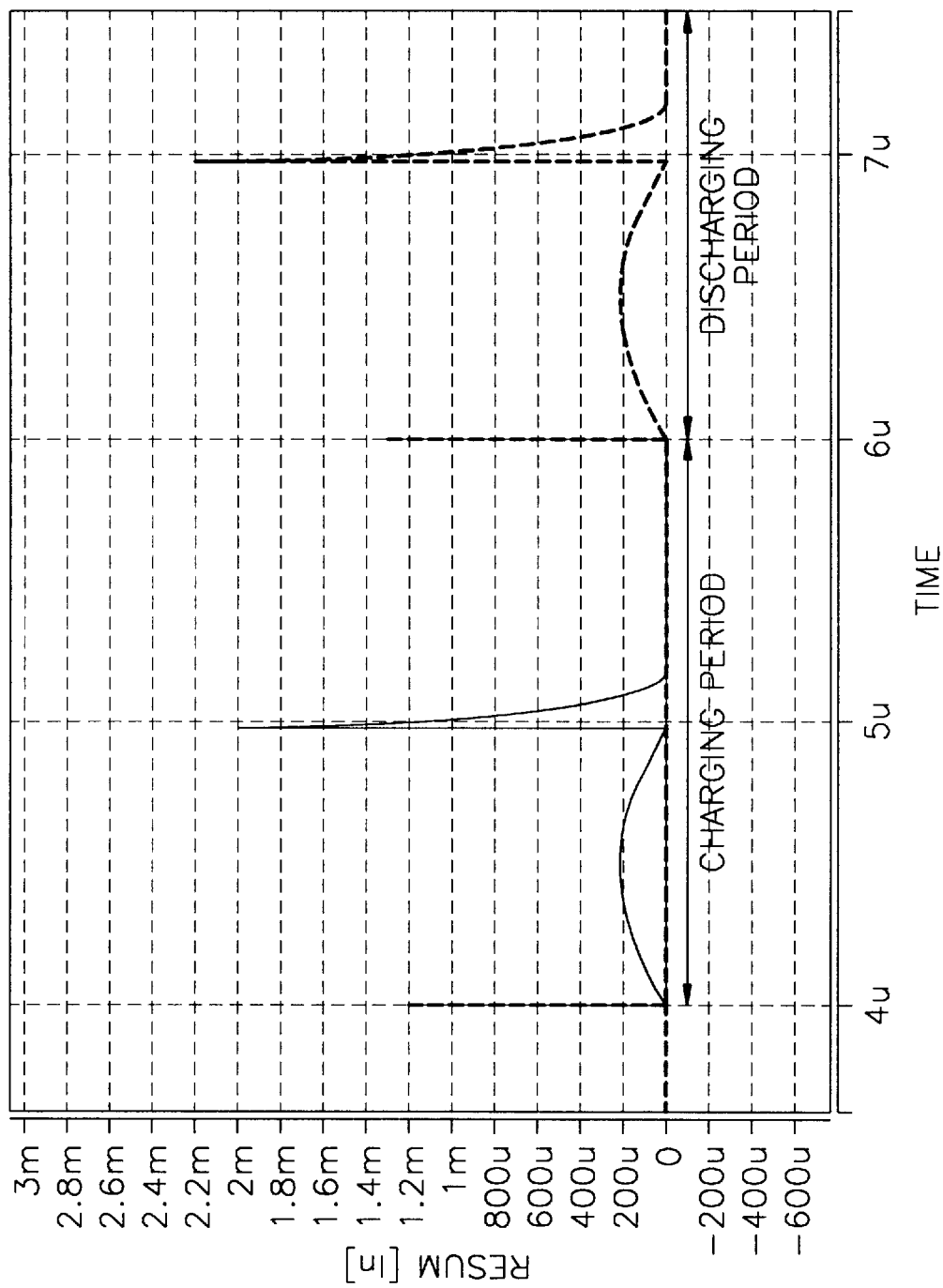
FIG. 10 is a graph showing the current flowing the circuit in FIG. 8.

FIG. 10 shows a graph of flowing current in the circuit of FIG. 8. Referring to FIG. 10, the current flows slowly during T1 thereby minimizing the power consumption, and thereafter a peak current is generated since logic circuit portion 14 is charged or discharged fast by CMOS power supply portion 12. However, in the circuit of FIG. 8, logic circuit portion 14 is charged/discharged to a predetermined voltage level by using adiabatic power supply portion 10, and then is charges to a final voltage by using CMOS power supply portion 12. That is, the charge required during CMOS power supply portion 12 is activated is much smaller than that required in conventional CMOS power supply method. Accordingly, the peak current generated during charge/discharge by CMOS power supply portion 12 is lower than that generated in the conventional CMOS power supply case.

Table 1 shows a comparison result of power consumption between the hybrid charging/discharging method and the conventional CMOS charging/discharging method. Here, the number of charge and discharged is done once.

TABLE 1

|  | Hybrid power supply/ CMOS power supply | Conventional CMOS power supply |
|---|---|---|
| Power consumption of all transistors (1) | 0.1411 | 1.0 |
| (1) + power consumption of diodes | 0.3411 | 1.0 |

Referring to Table 1, comparing the power consumed in all transistors results that the power consumption in the hybrid power supply circuit of the invention is about 14% of that in conventional CMOS power supply portion 12 only operating case. Also, comparing the power consumed in all transistors and diodes results that the hybrid power supply circuit consumes only 34% of only CMOS operating case.

Consequently, the use of the hybrid power supply circuit of the invention in charging/discharging logic circuit portion 14 reduces the power consumption by 70~90% comparing the conventional power consumption.

Figure 11:
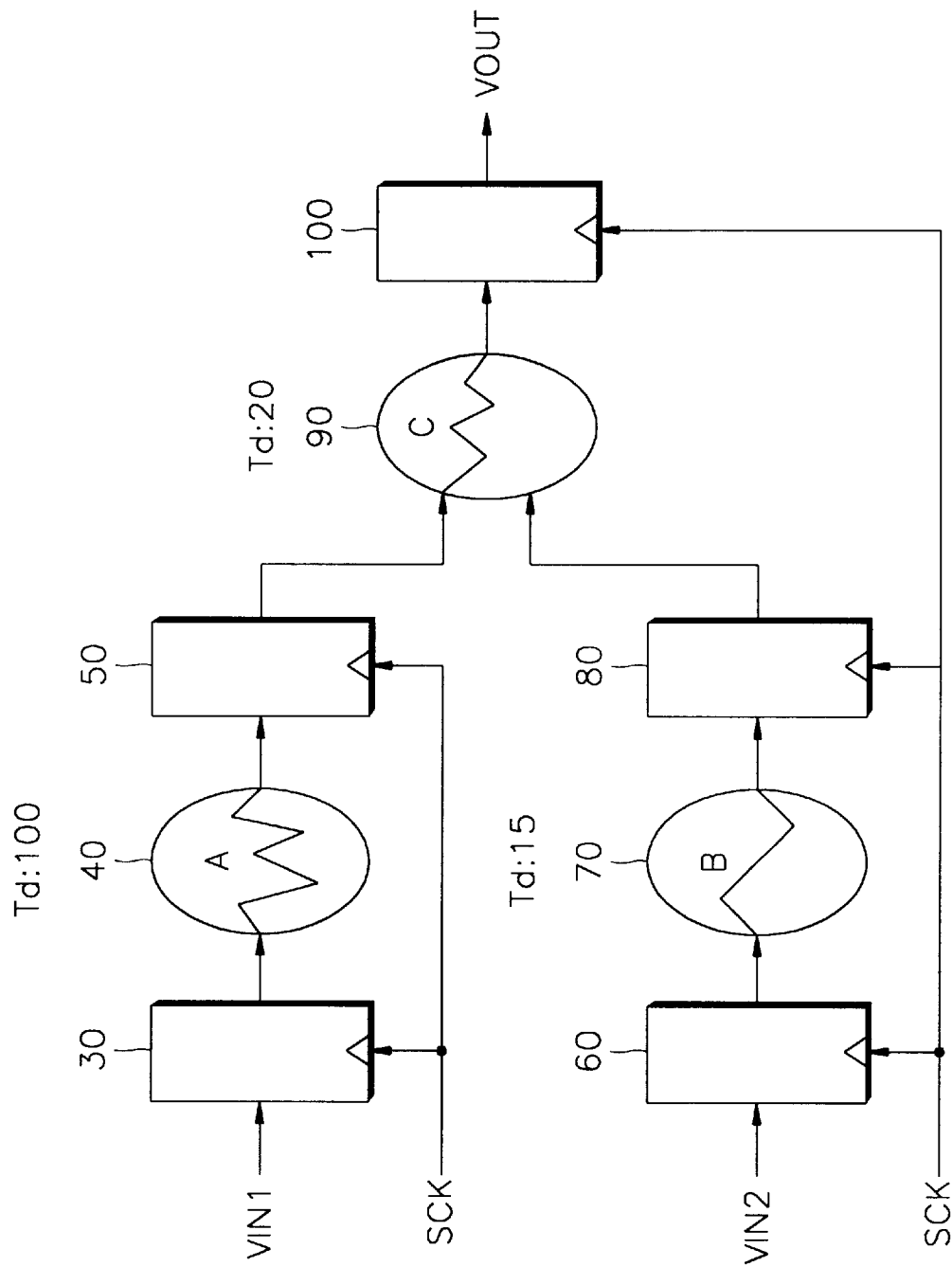
FIG. 11 is a block diagram showing a digital system having a plurality of logic circuits.

FIG. 11 is a block diagram of a digital system having a plurality of digital logic circuits. The digital system includes a plurality of registers 30, 50, 60, 80 and 100 and a plurality of logic circuits 40, 70 and 90.

Referring to FIG. 11, registers 30, 50, 60, 80 and 100 control the digital system to synchronize a system clock signal SCK. Here, logic circuits 40, 70 and 90 performs predetermined operations in response to input signals VIN1 and VIN2, and each logic circuit 40, 70 or 90 has a unique delay time Td. As an example in FIG. 11, a logic circuit A has a Td of 100, B has 70 and C has 20 (units of time, e.g., fractions of seconds, seconds, minutes, etc.). As this, in case that the delay times varies across the logic circuits, the system clock signal SCK is determined by a maximum delay time.

Logic circuit A inputs a input signal VIN1 synchronized with system clock signal SCK and performs a predetermined operation and outputs the result thereof. Logic circuit B inputs an input signal VIN2 synchronized with the system clock signal SCK and performs a predetermined operation so as to output the result thereof. Logic circuit C inputs the outputs of A and B while being synchronized with the SCK and performs a predetermined operation so as to output the results thereof. The register 100 outputs the output of logic circuit C through an output terminal VOUT while being synchronized with SCK. Here, the outputs from logic circuits A, B and C are digital signals each of which having a high or a low level. To operate the system like above, the logic circuits A, B and C must be charged or discharged.

Hereinafter, a method for effectively charging or discharging a plurality of logic circuits shown in FIG. 11 by using the hybrid power supply circuit in accordance with the invention will be described.

Figure 12:
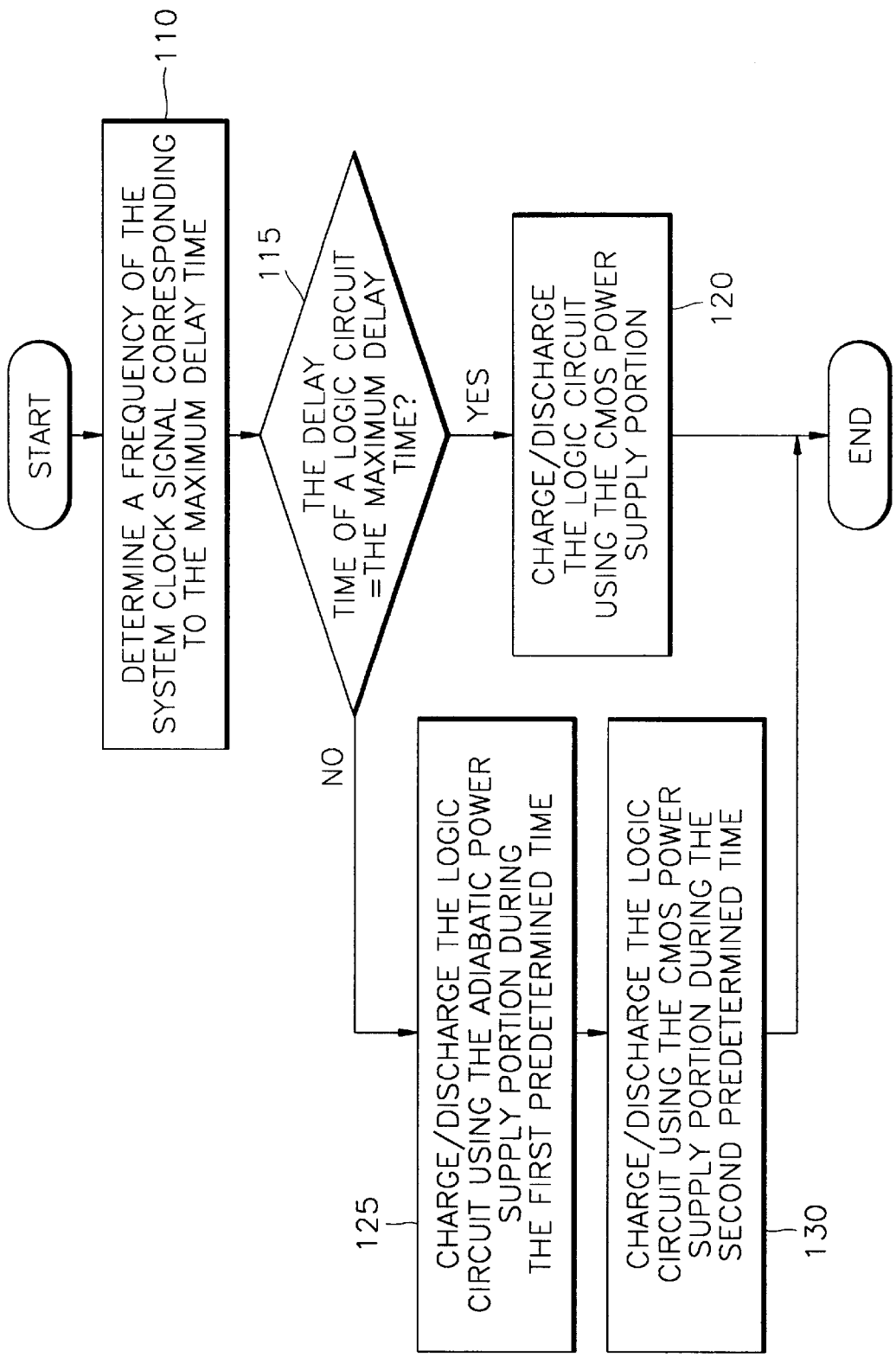
FIG. 12 is a flowchart of a method for effectively charging/discharging a plurality of logic circuits which constitute a digital system by using the hybrid power supply circuit.

FIG. 12 shows a flowchart illustrating a preferred embodiment of the invention, a method for effectively charging or discharging a plurality of logic circuits constituting a digital system.

Referring to FIGS. 11 and 12, firstly, a logic circuit having longest delay time than the others is extracted so as to determine a frequency of the system clock signal SCK with a maximum delay time being set to the extracted delay time (step 110). For example, the maximum delay time of the digital system in FIG. 11 is 100.

After step 110, a delay time of a logic circuit to be charged or discharged is compared with the maximum delay time determined at step 110 (step 115).

In step 115, when the delay time of the concerned logic circuit is identical to the maximum delay time, the CMOS power supply portion is activated to charge or discharge the logic circuit. That is, there is no time to charge/discharge the logic circuit having the maximum delay time by using the adiabatic power supply portion. Accordingly, even though there is a large power consumption, the logic circuit under consideration must be charged/discharged quickly. In the example, since the logic circuit A has the maximum delay time, it is charged/discharged by using the CMOS power supply portion.

To the contrary in step 115, if determining a delay time under consideration being shorter than the maximum delay time, the logic circuit under consideration is charged or discharged by using the adiabatic power supply portion during a first predetermined time (step 125). At this time, the charging/discharging time by using the adiabatic power supply portion is preferably set to the maximum delay time less the delay time of the logic circuit under concern in accordance with one embodiment of the invention. The logic circuit is charged or discharged by the adiabatic power supply portion during the first predetermined time. In some cases, there may be a room to further use the adiabatic power supply portion.

After the adiabatic charging/discharging, the logic circuit is quickly charged/discharged by using the CMOS power supply portion to a supply power level or a ground level (step 130). Preferably, the charging/discharging time by the CMOS power supply portion is set to the delay time of the logic circuit under concern. For example, when the logic circuit B or C is charged/discharged by using the CMOS power supply portion, there may be remained a spare time. That is, the logic circuit B has a spare time of 85 (units of time, e.g., seconds or minutes) compared with the logic circuit A in the delay time therebetween and C of 80 for example. In this case, during the first predetermined time, the maximum delay time less a delay time of a logic circuit under concern, the logic circuit is charged/discharged by using the adiabatic power supply portion. Then, the circuit is further charged/discharged by using the CMOS power supply portion during the delay time thereof. For example, the charging/discharging of logic circuit B is conducted by the adiabatic power supply portion for the delay time, 85, and then by the CMOS power supply portion for the remaining time 15.

As described above, by using the adiabatic power supply portion in charging/discharging logic circuits having a smaller delay time than the maximum delay time such as the logic circuits B and C, the power consumption can be reduced thereof while maintaining the performance of the whole system.

Preferred embodiments are provided in the drawings and specification. Specific terms used herein should not be construed as limiting the scope of this invention but fully convey the concept of the invention to those skilled in the art. Thus, it will be understood by those skilled in the art that various changes in form and details may be made therein without departing from the spirit and scope of the invention as defined by the appended claims.

What is claimed is:

1. A hybrid power supply circuit for supplying a power to a logic circuit performing a logic process in response to an input signal, and for charging/discharging the logic circuit, the hybrid power supply circuit comprising:

an adiabatic power supply portion for charging/discharging the logic circuit in such a manner to suppress a sudden current change during a first predetermined time after the input signal changes; and a CMOS power supply portion for charging/discharging the logic circuit to supply power level/ground level more quickly than a charging/discharging speed by the adiabatic power supply during a second predetermined time following the first predetermined time.

2. The hybrid power supply circuit as claimed in claim 1, further comprising means for blocking an inverse current during the charging/discharging by the adiabatic power supply portion.

3. The power supply circuit as claimed in claim 2, wherein the blocking means includes:

a first blocking portion for blocking a current to the adiabatic power supply portion from the logic portion during the charging by the adiabatic power supply portion; and a second blocking portion for blocking a current to the logic portion from the adiabatic power supply portion during the discharging by the adiabatic power supply portion.

4. The power supply circuit as claimed in claim 3, wherein the first blocking portion includes a first diode connected in a forward current flow from the adiabatic power supply to the logic circuit and the second blocking portion includes a second diode connected in a forward current flow from the logic circuit to the adiabatic power supply between the adiabatic power supply portion and the logic circuit.

5. A method for charging/discharging a logic circuit performing a digital logic algorithm in response to an input signal by using a hybrid power supply circuit having an adiabatic power supply portion and a CMOS power supply portion, the method comprising the steps of:

charging/discharging the logic circuit according to an output thereof by using the adiabatic power supply portion during a first predetermined time after the input signal changes; and charging/discharging the logic circuit to a required level by using the CMOS power supply portion during a second predetermined time after the first predetermined time.

6. A method for charging/discharging a plurality of logic circuits in a digital system having the logic circuits operating synchronized to a system clock signal determined by a maximum delay time and a hybrid power supply circuit including an adiabatic power supply portion and a CMOS power supply portion for supplying a power to the logic circuits, the method comprising the steps of:

(a) comparing all of the delay time of the logic circuits so as to determine the maximum delay time and comparing a delay time of a logic circuit to be charged/discharged with the maximum delay time;

(b) charging/discharging the logic circuit to a required level by using the CMOS power supply portion if the delay time of the logic circuit is identical to the maximum delay time in step (a);

(c) charging/discharging the logic circuit by using the adiabatic power supply portion during a first predetermined time if the delay time of the logic circuit under concern is shorter than the maximum delay time in step (a); and (d) charging/discharging the logic circuit to a supply power level or a ground level by using the CMOS power supply portion after the first predetermined time.

7. The method as recited in claim 6, wherein the first predetermined time in step (c) is set to the maximum delay time less the delay time under concern.

8. The method as claimed in claims 6, wherein the hybrid power supply circuit further includes an inverse current blocking means so as to block the inverse current during the first predetermined time.

9. The method as claimed in claim 8, the inverse current blocking means includes:

a first blocking portion for blocking a current to the adiabatic power supply portion from the logic portion during the charging by the adiabatic power supply portion; and a second blocking portion for blocking a current to the logic portion from the adiabatic power supply portion during the discharging by the adiabatic power supply portion.

10. The power supply circuit as claimed in claim 9, wherein the first blocking portion includes a first diode connected in a forward current flow from the adiabatic power supply to the logic circuit and the second blocking portion includes a second diode connected in a forward current flow from the logic circuit to the adiabatic power supply between the adiabatic power supply portion and the logic circuit.

11. The method as claimed in claim 7, wherein the hybrid power supply circuit further includes an inverse current blocking means so as to block the inverse current during the first predetermined time.

12. The method as claimed in claim 11, the inverse current blocking means includes:

a first blocking portion for blocking a current to the adiabatic power supply portion from the logic portion during the charging by the adiabatic power supply portion; and a second blocking portion for blocking a current to the logic portion form the adiabatic power supply portion during the discharging by the adiabatic power supply portion.

13. The power supply circuit as claimed in claim 9, wherein the first blocking portion includes a first diode connected in a forward current flow from the adiabatic power supply to the logic circuit and the second blocking portion includes a second diode connected in a forward current flow from the logic circuit to the adiabatic power supply between the adiabatic power supply portion and the logic circuit.

14. The power supply circuit as claimed in claim 12, wherein the first blocking portion includes a first diode connected in a forward current flow from the adiabatic power supply to the logic circuit and the second blocking portion includes a second diode connected in a forward current flow from the logic circuit to the adiabatic power supply between the adiabatic power supply portion and the logic circuit.

* * * * *